Figure 1:
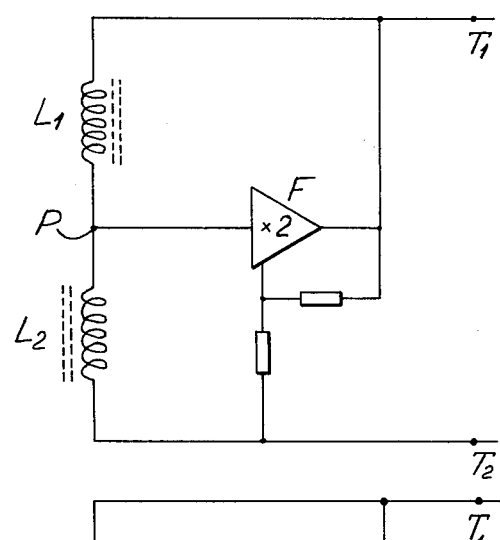

United States Patent [19]

Baekgaard

[11] 4,442,434
[45] Apr. 10, 1984

[54] ANTENNA CIRCUIT OF THE NEGATIVE IMPEDANCE TYPE

[75] Inventor: Knud E. Baekgaard, Struer, Denmark

[73] Assignee: Bang & Olufsen A/S, Struer, Denmark

[21] Appl. No.: 243,623

[22] Filed: Mar. 13, 1981

[30] Foreign Application Priority Data

Mar. 13, 1980 [DK] Denmark .................... 1070/80

[51] Int. Cl.³ .................... H01Q 1/26; H01Q 7/06
[52] U.S. Cl. .................... 343/701; 455/274; 455/291; 343/788
[58] Field of Search ............... 343/701, 748, 788, 861; 455/274, 291

[56] References Cited

U.S. PATENT DOCUMENTS

| 3,633,109 | 1/1972 | Schulz | 455/291 |
| 3,721,989 | 3/1973 | Christensen | 343/788 |
| 3,953,799 | 4/1976 | Albee | 343/701 |
| 4,314,378 | 2/1982 | Fowler | 455/291 |

Primary Examiner—Eli Lieberman
Attorney, Agent, or Firm—Antonelli, Terry & Wands

[57] ABSTRACT

An aerial circuit comprises a first antenna in connection with an impedance, which is a "negative impedance", whereby a broad frequency range is achieved. The "negative impedance" is based on a second antenna similar to the first antenna, whereby the resulting aerial impedance is zero for all frequencies. A corresponding ferrite or loop aerial system is advantageously usable as a stationary system instead of an antenna of the long wire type, and the signal to noise ratio is better than with conventional ferrite antennas.

9 Claims, 2 Drawing Figures

ANTENNA CIRCUIT OF THE NEGATIVE IMPEDANCE TYPE

This invention relates to an aerial circuit.

Conventional antennas for radio receivers are connected in a resonant circuit, which has an extremely small impedance in a frequency range about the resonant frequency, whereby the received weak radio waves can produce a reasonably strong aerial signal for amplification in a receiver. If the receiver is provided with a variable tuning circuit, a selective separation of signals of respective different frequencies corresponding to different transmitter stations is possible. The aerial circuit is designed so as to have a broad effective frequency range, whereby it is able to receive a wide spectrum of signals from many different transmitters. However, the gain of the antenna is considerably reduced for frequencies near the limits of the frequency range, and it is common practice, therefore, that the receiver has a selector switch for adaption of the aerial circuit to different wave length ranges, e.g. long waves, medium waves and one or more short wave ranges, with the selector connecting the antenna with different impedances for a suitable change of the resonant frequency and range of the aerial system.

Principally it would be attractive to make the aerial circuit effective over a very broad range without selection between the different sub ranges, and, in fact, a proposal to this end is known from the British Patent Specification No. 1,231,022, which discloses a dipole antenna connected with an impedance of the "negative impedance" type, i.e. an electrical compensation circuit designed so as to imitate the frequency response of the antenna itself. By means of an associated amplifier this imitated impedance is added to the antenna impedance with an opposite sign, such that the resulting impedance of the aerial circuit is ideally zero at all frequencies. In practice, however, this ideal result is hardly achievable, because inevitably some deviations will exist between the frequency characteristics of the antenna impedance and the compensation impedance, and even slight deviations will be significant enough to produce a non-ideal result.

It is the primary purpose of the invention to provide an aerial circuit of the "negative impedance" type, which may be designed to achieve a practically ideal elimination of the resulting aerial impedance and thus a good gain of the antenna for all frequencies over a very broad frequency range.

According to the invention the antenna imitating impedance is constituted by an auxiliary antenna of the same type as the primary antenna, preferably entirely similar thereto. Thus, the "negative impedance" is based on an antenna and not on a synthetic imitation circuit, whereby any possible irregularity in the frequency characteristic of the primary antenna will automatically be duplicated in the auxiliary antenna, as the two antennas will respond entirely or widely in the same manner to any frequency, and thereby a practically absolute elimination of the resulting aerial impedance is achievable irrespective of the irregularities.

The invention furthermore recognizes the usability of the "negative impedance" for widening the effective frequency range of an aerial system is not limited to dipole antennas, as experiments have shown that a corresponding principle may very advantageously be applied to ferrite antennas or similar antennas responding to the magnetic aspect of the electromagnetic radio waves, while the dipole antennas respond to the electrical aspect or field thereof. With a ferrite antenna it is not possible to use a "negative impedance" of the same type as suggested for use with the dipole antennas, but a "negative coil" is perfectly usable, and it will be particularly effective for the desired complete elimination of the resulting aerial impedance when it is based on an antenna coil and an associated magnetic core fully corresponding to the primary ferrite antenna. Ideally two completely similar antennas should be mounted adjacent each other without mutual inductive coupling, with the "negative" impedance coupling between them being so effected that it is hardly possible to distinguish between a primary and an auxiliary antenna, since the total system will show two equal antennas and an intermediate, electrically active coupling circuit.

Conventionally, the most effective type of antenna for radio waves over a wide frequency range, at least in the AM-range, is the so-called "long wire antenna", i.e. a long wire insulated from the ground. This type of antenna, however, shows three main disadvantages, viz.: it can be difficult to mount; It is not suited for portable receivers (though well suited as a stationary antenna therefor); and it willingly receives not only radio waves, but also electrical noise signals from many sources of noise, e.g. sparks in car motors or electromotors in the neighborhood of the antenna.

Ferrite antennas distinguish themselves by not showing these disadvantages, while their disadvantage is that their efficiency is quite low. Since they are compact and of small size they are easy to mount practically everywhere, and they are well suited for use inside portable radio sets, this being the predominating field of use of these antennas. It has been found that the magnetic component of the radio waves, as compared to the electrical component, is far less infestable with random noise from phenomena in the near surroundings, and, even though the antenna gain is much weaker than in a "long wire antenna", the signal may be subjected to a very high degree of amplification without the received noise being disturbing. In other words, the signal to noise ratio of a ferrite antenna is far better than for a long wire antenna, and the efficiency of a built-in ferrite antenna, therefore, is generally satisfactory. It only remains that the built-in antenna is bound to follow the receiver, i.e. the reception will be poor whenever the receiver is brought into surroundings, e.g. inside a building of reinforced concrete, where the radio waves are extra weak and often unreceivable.

In such surroundings, therefore, it will normally be desirable or necessary that an outside antenna be mounted in a more favorable position, and normally portable radios are correspondingly provided with a socket for an antenna plug for connection to such a stationary antenna, whereby, of course, the drawback should be accepted that the portable radio by such connection will be movable to a limited degree only.

Under these circumstances, it would be highly desirable that the stationary exterior antenna could be of the ferrite type, because such an antenna, due to its small size, will be much easier to mount than a long wire antenna. In practice, however, such use of a ferrite antenna has been excluded by the fact that the effective frequency range of conventional ferrite antennas has been too small for ordinary use, and, for various reasons, it would be unattractive to arrange for a remote controlled switching between different antenna coils on the basic magnetic core of the antenna for adaption to different frequency ranges.

However, with the use of the above mentioned "negative coil" or "negative inductance" it will be possible to achieve such a wide ranged elimination of the resulting impedance of the ferrite antenna that the antenna will be usable over the required broad frequency range without any need of remote selection between sub ranges thereof. Consequently it will then be possible in practice to replace an exterior long wire antenna by a ferrite antenna which is indeed much easier to mount. It will even be possible to make use of the simple type of antenna from which the ferrite antenna has been developed, viz. the so-called frame antenna, which is an effective and simple antenna, which just requires more space than the ferrite antenna; however, for the stationary mounting, the extra space requirements of a frame antenna will not normally be of any importance.

As well known, ferrite and frame antennas are directional, which is both advantageous and disadvantageous according to the circumstances. In a stationary installation, however, it is possible to mount the antenna or set of antennas so as to suppress noise signals from certain directions, and besides it is possible to use two antennas or antenna sets with preferred directions or electrically coupled so as to be non-directional in total.

For achieving a broad frequency range and a good antenna gain, it may be desirable to use a high number of windings on the antenna coil or coils, and many windings condition a high so-called parallel capacity of the coil, which is undesired in conventional aerial circuits. However, with the use of a "negative coil", according to the invention, even the parallel capacity will be compensated for or eliminated, and the invention, therefore, makes it possible to increase the number of windings compared with the known art, whereby the efficiency of the aerial system may be still further increased.

With the use of a parallel or auxiliary ferrite or frame antenna in the negative impedance circuit the following additional advantage is obtained: The received wave signal will occur in both antennas, and, because the signals are well oriented they may be simply added to each other, while the unavoidable self generated noise in the two antennas or the coils thereof will be of random orientation, whereby the corresponding sum of the noise signals from the two antennas will not amount to a doubling of the signal, but only to an increase by the factor $\sqrt{2}$, i.e. the signal to noise ratio will be $\sqrt{2}$ times better than in conventional antenna circuits, this being a significant advantage of the invention.

Figure 2:
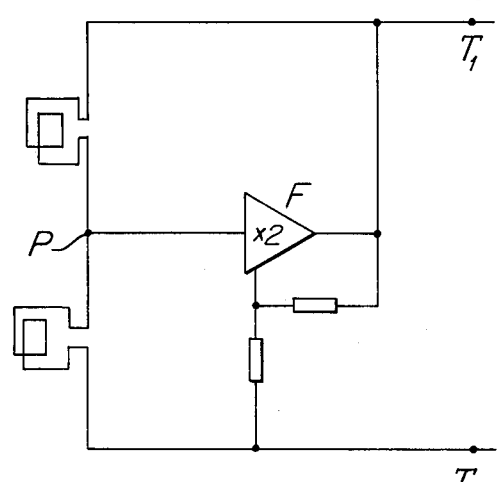

FIG. 1 is a schematic diagram of a first embodiment of an aerial circuit constructed in accordance with the present invention; and FIG. 2 is a schematic diagram of another embodiment of an aerial circuit constructed in accordance with the present invention.

On a first ferrite rod is mounted a coil $L_1$, and on a separate ferrite rod is mounted another coil $L_2$, the coils being entirely or substantially similar and connected in series in an aerial circuit having terminals $T_1$ and $T_2$. Between the terminal $T_1$ and the common point P of the two coils is mounted an amplifier F, to which power is supplied in any suitable manner, e.g. through the connection wires between the terminals $T_1$, $T_2$ and the associated radio receiver (not shown). It is also possible, as shown in FIG. 2, for the aerial circuit to be of the frame (loop) type and to be provided without a core of ferrite or a corresponding material. If or when the inductance of the two coils $L_1$, $L_2$ are identical the amplifier F should show the amplification factor of two. It receives its input from the coil $L_2$ and supplies the amplified output to the coil $L_1$ in such a manner that the coil $L_1$ receives a voltage which is equal to, but also opposed to the voltage simultaneously being generated in the coil $L_1$, just as in $L_2$. The coils $L_1$, $L_2$ can be equated with voltage generators, and the total "impedance" of the series connected coils and the amplifier, as seen from these voltage generators, will thus be zero for any frequency, and consequently, the full effect of the aerial circuit is at disposal for all frequencies.

Even though the resulting impedance of the coil system is zero, there will nevertheless exist, vectorially, a voltage between the ends of the system, viz. twice the induced voltage, and this signal is applied to the selective tuning circuit of the radio receiver through wires which may well be quite long. The two coils $L_1$, $L_2$ are mutually "negative", but the induced energy in both coils $L_1$, $L_2$ will be added to the available output signal. As mentioned, the vectorially co-directional signals of the two coils $L_1$, $L_2$ will be added to the double value (gain increase 6 dB), because they are correlated, while self generated non-correlated noise signals are only added to $\sqrt{2}$ of their value, i.e. the noise increase will be 3 dB only, such that the resulting signal to noise ratio will be considerably improved.

In practice the amplifier F may consist of a single field effect transistor having its gate connected to the point P, its drain connected to the power supply and its source connected to the midpoint of an auto transformer connected between the opposite ends of the coil system, preferably an auto transformer having a so-called toroid ring core.

The impedance of the coil $L_1$ may be chosen so as to be different from $L_2$, and the amplification A in amplifier F should then just satisfy the condition:

$$A \leq (L_1/L_2) + 1.$$

As mentioned, it will be highly advantageous to use two practically similar coils $L_1$, $L_2$, but principally it would be possible to produce a "negative coil" by other circuits, e.g. a condenser in connection with a so-called negative impedance converter.

It will be appreciated that an antenna system according to the invention may have a very broad effective frequency range, though, of course, certain limits will exist for practical reasons. It would, of course, still be possible to arrange for a switch over arrangement should it be desired to cover a still broader range. Alternatively two sets of antenna circuits may be used and connected to the receiver through separate wires, whereby the switch over may be effected from the radio receiver.

As mentioned, two or several antenna circuits may be used together to produce a non-directional antenna system, and the invention will be perfectly usable in large systems e.g. commercial or common antenna systems, in which a "battery" of effective ferrite or frame antennas will show small space requirements.

The invention is not limited to any particular type or types of antennas, not even to radio receiver antennas. Thus, a ferrite or frame antenna system according to the invention will be usable with advantage in receivers in so-called "teleloop" systems, which are based solely on magnetic induction between a large loop and the receivers inside the loop and, in that case, there is usually no need to consider any particularly broad frequency range, as mostly only audio frequencies are in question, but already the improved signal to noise ratio of the antenna circuit will make it advantageous in use. Other fields of application will be tone heads in tape recorders, air coils in pick up's and coils for short range wireless data transmission. The principles of the invention may even apply to some transmitter antennas, in which the system of the invention may contribute to the attainment of a high antenna current.

What is claimed is:

1. An aerial circuit comprising a main antenna and a negative impedance means for producing a broad effective frequency range of the aerial circuit the negative impedance means comprising an amplifier and a frequency dependent impedance imitating an impedance of the main antenna and seeking to eliminate the same through the amplifier, characterized in that the frequency dependent impedance is constituted by an auxiliary antenna of a similar type as the main antenna.

2. An aerial circuit according to claim 1, characterized in that the auxiliary antenna is of the same type as the main antenna.

3. An aerial circuit according to claim 2, characterized in that the main antenna is a ferrite type with a core of ferrite or a corresponding material for reception of at least one of magnetic or electromagnetic wave signals, the auxiliary antenna is of the same type, and in that the frequency dependent impedance is a negative coil.

4. An aerial circuit according to claim 3, characterized in being mounted as a stationary system with respective coils of the two antennas inductively insulated from each other.

5. An aerial circuit according to claim 2, characterized in that the main antenna is a frame type antenna for receiving at least one magnetic or electromagnetic wave signals, the auxiliary antenna is of the same type, and in that the frequency dependent impedance is a negative coil.

6. An aerial circuit comprising a first antenna means and a second antenna means independent of and electrically connected to said first antenna means, said second antenna means including a frequency dependent impedance means for imitating an impedance of the first antenna means and an amplifier means electrically connected to a common point between the first and second antenna means, the frequency dependent impedance is constructed as a negative coil means, the first antenna means includes a ferrite rod means having a core mounted thereon, the second antenna means includes a separate ferrite rod means having a further coil mounted thereon, wherein an impedance of the coils and amplification of the amplifier means satisfies the following conditions:

$$A \leq (L_1/L_2) + 1,$$

wherein:
$L_1$ equals impedance of the coil of the first antenna means,
$L_2$ equals impedance of the coil of the second antenna means, and
A equals amplification of the amplifier means.

7. An aerial circuit according to claim 6, wherein the amplifier means includes a single field effect transistor means.

8. An aerial circuit according to claim 6, wherein said first and second antenna means are inductively isolated.

9. An aerial circuit comprising an antenna and a negative impedance means for producing a broad effective frequency range of the aerial circuit, the negative impedance means comprising an amplifier and a frequency dependent impedance imitating an impedance of the antenna and seeking to eliminate the same through the amplifier, characterized in that the frequency dependent impedance is constituted by an auxiliary antenna of the same type as the main antenna, the aerial circuit being mounted as a stationary system with the two antennas being inductively isolated from each other.

* * * * *